(12) United States Patent
Nieves et al.

(10) Patent No.: US 11,796,590 B2
(45) Date of Patent: Oct. 24, 2023

(54) LOCALIZED HEATING/COOLING USING THERMOCOUPLE BETWEEN PROBE PINS

(71) Applicant: INTERNATIONAL BUSINESS MACHINES CORPORATION, Armonk, NY (US)

(72) Inventors: Pablo Nieves, Pinebluff, NC (US); Kushagra Sinha, Wappingers Falls, NY (US); Reinaldo Vega, Mahopac, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 145 days.

(21) Appl. No.: 17/536,211

(22) Filed: Nov. 29, 2021

(65) Prior Publication Data
US 2023/0168297 A1   Jun. 1, 2023

(51) Int. Cl.
*G01R 31/28* (2006.01)
*H01L 21/66* (2006.01)
*G01R 31/319* (2006.01)

(52) U.S. Cl.
CPC ..... *G01R 31/2891* (2013.01); *G01R 31/2884* (2013.01); *G01R 31/31905* (2013.01); *H01L 22/34* (2013.01)

(58) Field of Classification Search
CPC ............ G01R 31/2891; G01R 31/2884; G01R 31/31905; H01L 22/34
USPC ............ 324/754.1, 754.03, 754.01, 537, 500
See application file for complete search history.

(56) References Cited

U.S. PATENT DOCUMENTS

| | | | | |
|---|---|---|---|---|
| 3,332,285 A * | 7/1967 | Cook | ..................... | G01K 13/00 374/134 |
| 4,156,840 A * | 5/1979 | Rowsey | ................... | G01R 5/22 324/451 |
| 4,344,315 A * | 8/1982 | Moxon | .................. | G01N 25/18 374/44 |
| 5,043,560 A | 8/1991 | Masreliez | | |
| 2005/0287685 A1* | 12/2005 | McFadden | ......... | G01R 31/2874 700/121 |
| 2018/0156863 A1* | 6/2018 | Song | ...................... | H05B 6/105 |
| 2021/0382108 A1* | 12/2021 | Kanev | ..................... | G01K 7/01 |

OTHER PUBLICATIONS

Miralles et al., "A Review of Heating and Temperature Control in Microfluidic Systems: Techniques and Applications", Diagnostics Mar. 2013, 3, 33-67; doi:10.3390/diagnostics3010033.
Bright Hub Engineering, "What is a Thermocouple and How Does it Work? Principle of Working of Thermocouple", https://www.brighthubengineering.com/manufacturing-technology/53682-what-is-a-thermocouple-how-thermocouple-works. Oct. 27, 2009, pp. 1-6.

* cited by examiner

*Primary Examiner* — Giovanni Astacio-Oquendo
(74) *Attorney, Agent, or Firm* — Tutunjian & Bitetto, P.C.; Samuel Waldbaum

(57) ABSTRACT

A system includes probe pins each including a probe tip and a plurality of thermocouples arranged such that at least one thermocouple is positioned between a pair of the probe pins. The plurality of thermocouples can be placed adjacent or above a device under test (DUT). The probe tips of the probe pins are placed over a plurality of pads. The plurality of thermocouples are placed adjacent or between the plurality of pads. The at least one thermocouple positioned between the pair of the probe pins can be either a single thermocouple or a thermocouple array.

16 Claims, 8 Drawing Sheets

LOCALIZED HEATING/COOLING USING THERMOCOUPLE BETWEEN PROBE PINS

BACKGROUND

The present invention relates generally to semiconductor manufacturing and testing, and more specifically, to localized heating or cooling using a thermocouple between probe pins.

Semiconductor reliability tests, which are known as wafer level reliability (WLR) tests, are usually carried out by wafer probers at ambient temperatures as high as 350° C. For electrical testing of semiconductor wafers, a set of probes on a probe card are usually held in place while the semiconductor wafer (mounted on a chuck) is moved into electrical contact with the probe card. The wafer can be vacuum-mounted on a heated chuck. After a die (or array of dice) have been electrically tested, the prober then moves the wafer to the next die (or array) for the next test to begin. The wafer prober also loads and unloads the wafers from their carrier (or cassette). A wafer prober can also have automatic pattern recognition optics capable of aligning the contact pads on the wafer with the tips of the probes.

SUMMARY

In accordance with an embodiment, a system is provided. The system includes probe pins each including a probe tip and a plurality of thermocouples arranged such that at least one thermocouple is positioned between a pair of the probe pins.

In accordance with another embodiment, a system is provided. The system includes probe pins each including a probe tip and a plurality of thermocouples each including a first thermocouple wire and a second thermocouple wire such that a first series of thermocouples of the plurality of thermocouples are electrically connected to the first thermocouple wire and a second series of thermocouples of the plurality of thermocouples are electrically connected to the second thermocouple wire.

In accordance with yet another embodiment, a method is provided. The method includes using probe pins each including a probe tip and arranging a plurality of thermocouples such that at least one thermocouple is positioned between a pair of the probe pins.

It should be noted that the exemplary embodiments are described with reference to different subject-matters. In particular, some embodiments are described with reference to method type claims whereas other embodiments have been described with reference to apparatus type claims. However, a person skilled in the art will gather from the above and the following description that, unless otherwise notified, in addition to any combination of features belonging to one type of subject-matter, also any combination between features relating to different subject-matters, in particular, between features of the method type claims, and features of the apparatus type claims, is considered as to be described within this document.

These and other features and advantages will become apparent from the following detailed description of illustrative embodiments thereof, which is to be read in connection with the accompanying drawings.

BRIEF DESCRIPTION OF THE DRAWINGS

The invention will provide details in the following description of preferred embodiments with reference to the following figures wherein.

Throughout the drawings, same or similar reference numerals represent the same or similar elements.

DETAILED DESCRIPTION

Figure 1:
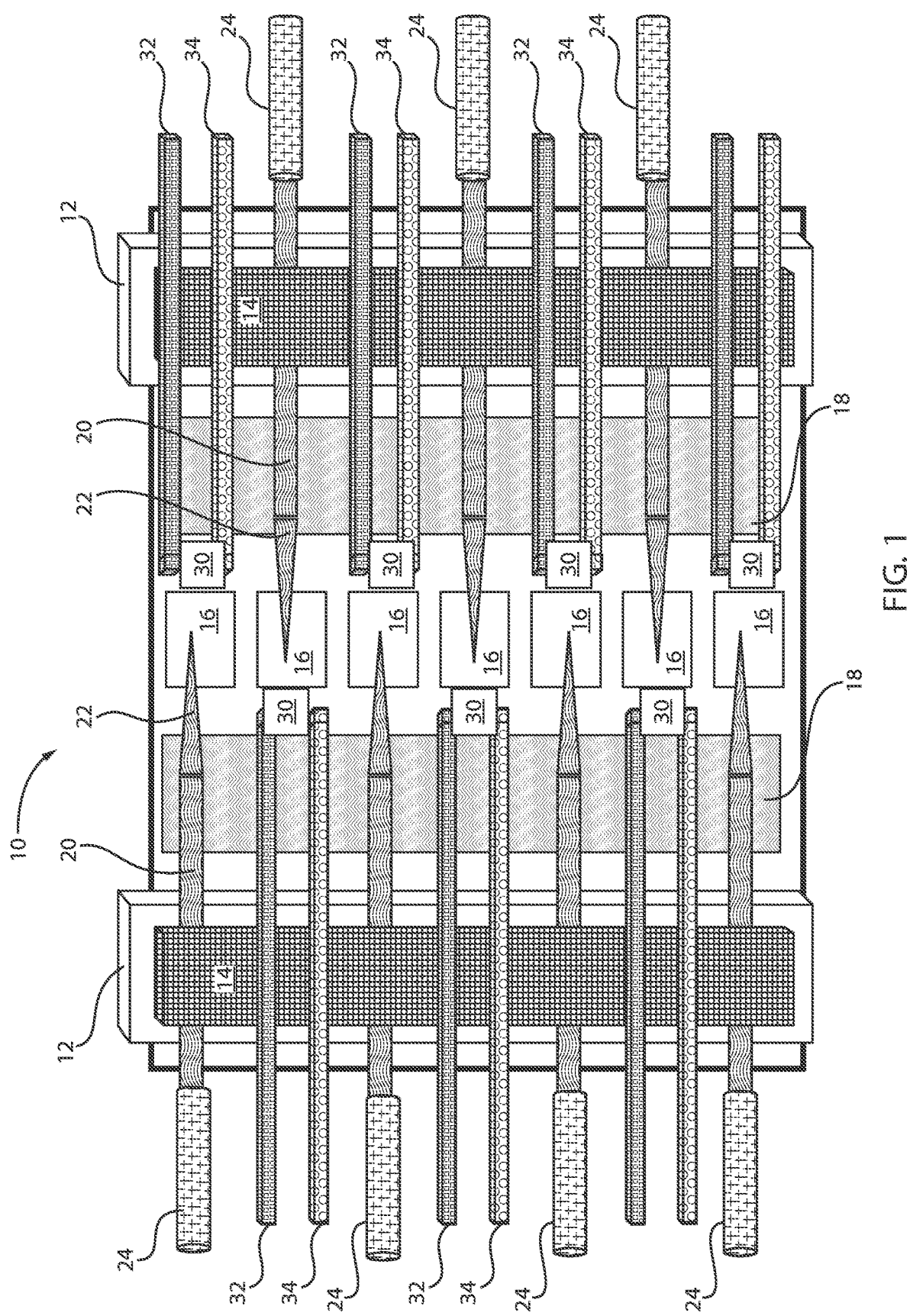
FIG. 1 illustrates testing of a device where a single thermocouple is placed between each of the probe pins along the wafer pads, in accordance with an embodiment of the present invention.

Embodiments in accordance with the present invention provide for a thermocouple strategically placed in a probe card assembly above the device under test (DUT) on a semiconductor wafer. A voltage or current input is applied to the thermocouple, which results in heating of one of the regions in the thermocouple and cooling of the other regions. The controlled input voltage or current is used to control the temperature.

The semiconductor chip fabrication industry continues to strive for reductions in costs. One of the major strategies to reduce the production cost per chip is to migrate towards the use of larger diameter semiconductor wafers. Current semiconductor foundries primarily use 200 mm (8 inch) and 300 mm (12 inch) silicon wafers. By migrating to use of 450 mm wafers, the number of dies (of the same size) produced from each wafer will increase approximately in proportion to the growth in the area of the wafer. Thus, a 450 mm wafer can yield 2.25 times as many chips as a 300 mm wafer.

Semiconductor integrated circuit (IC) chips have layers stacked such that layer features overlay one another to form individual devices and connect devices together. ICs are mass produced by forming an array of chips on a thin semiconductor wafer. Each array location is known as a die. A wafer may be as large as a dinner plate or larger, e.g., 12 inches (300 millimeters or 300 mm), with projections for 18 inch (450 mm) wafers in the near future. Larger wafers allow for more die per wafer for a given die size. At the same time, increased logic complexity requires a higher input/output (I/O) count.

Each die may harbor a multilayered structure, such as an IC chip or a structure for test or alignment. The surface layer of each completed chip or die is usually populated by probe-able off-chip pads for connecting to chip power and input/output (I/O) signals. Packing more function on each die usually means providing more and more I/O signals for each die, on one (a top) surface, or for a three dimensional (3D) chip structure, both (top and bottom) surfaces. Each die has at least one surface pad for each I/O signal and a number of power (supply and ground) connection pads. Increasing I/O signal and supply pad count for a given die size requires a tighter I/O pad pitch for dense I/O pad arrays, and correspondingly, a tighter test probe pitch. An IC wafer, for example, die may be populated by several thousand connection pads on very tight a pitch less than 50 microns (<50 µm).

Testing these tightly packed pads with or without solder balls requires very fine, delicate, tightly-packed test probes. Historically, what are known as cobra probes were used to probe down to 150 µm. Probing tightly-packed pads at 50 µm and below requires very precise probe tip geometry control and scalability. Achieving necessary probe tip precision for probing ultra-fine pitch pads has proven very difficult, and therefore, expensive. Moreover, in addition to increasing test time, repetitively shifting from one die to the next during manufacturing test, tends to degrade probe quality for these very fine, delicate, tightly-packed test probes.

Previously, multisite testing was unavailable for wafers populated by complex logic chips. Large probe heads, especially wafer level probe heads, could be used for testing low pin count memory chips, where it may be relatively easy to make contact to multiple memory dies simultaneously. However, these large probe head test cards were very expensive to build and to maintain. Moreover, these large probe heads have been limited to low pin count applications, which made the probes unattractive for high input/output (I/O) count logic chips. The poor precision of these traditional probes has made high pin count probe heads unsuitable, especially when considering the level of probe force that may be required to contact all of chip pads for chips under test. Thus, there is a need for low cost multi-chip test probes for temperature testing.

Embodiments in accordance with the present invention provide a method and structure for strategically placing a probe card assembly above the DUT on a semiconductor wafer. A voltage or current input is applied to the thermocouple, which results in heating of one of the regions in the thermocouple and cooling of the other. The controlled input voltage or current is used to control the temperature. As a result, localized heating and cooling of the DUT is realized, thus eliminating the need to subject the entire wafer to temperature testing.

Examples of semiconductor materials that can be used in forming such structures include silicon (Si), germanium (Ge), silicon germanium alloys (SiGe), silicon carbide (SiC), silicon germanium carbide (SiGeC), III-V compound semiconductors and/or II-VI compound semiconductors. III-V compound semiconductors are materials that include at least one element from Group III of the Periodic Table of Elements and at least one element from Group V of the Periodic Table of Elements. II-VI compound semiconductors are materials that include at least one element from Group II of the Periodic Table of Elements and at least one element from Group VI of the Periodic Table of Elements.

It is to be understood that the present invention will be described in terms of a given illustrative architecture; however, other architectures, structures, substrate materials and process features and steps/blocks can be varied within the scope of the present invention. It should be noted that certain features cannot be shown in all figures for the sake of clarity. This is not intended to be interpreted as a limitation of any particular embodiment, or illustration, or scope of the claims.

In general, a multi-chip probe head has application to simultaneously testing multiple electronics chips, such as Internet of Things (IoT) devices and wearable device chips, manufactured on ultra-thin wafers. These thin wafers are characterized by large quantities (hundreds to thousands or more) of dies with small, tightly packed signal and power supply pads. Thus, for such a wafer, even a single quadrant may include hundreds, thousands or more chip pads, e.g., 700,000 pads, for functional test. A test probe assembly has equally tightly packed probes with high co-planarity such that all the probes contact all test points for all of the multiple devices under test (DUTs) even with low probe force. Thus, the multi-chip test probe structure (e.g., probes, probe head and connecting interposer(s)) lends itself to high pin count applications, up to and including, for full wafer level functional testing.

FIG. 1 illustrates testing of a device where a single thermocouple is placed between each of the probe pins along the wafer pads, in accordance with an embodiment of the present invention.

In various example embodiments, the testing system 10 includes a plurality of probe pins 20 each including a probe tip 22 at a distal end thereof. The probe tips 22 are positioned over a plurality of pads 16. The proximal end of the plurality of probe pins 20 includes a non-magnetic sheath 24 over copper. The plurality of probe pins 20 extend over a ceramic ring 12 including an epoxy 14 thereon. A thermocouple 30 is placed or positioned between the probe tips 22 of the plurality of probe pins 20. The thermocouples 30 are positioned adjacent the probe tips 22 of the plurality of probe pins 20. The thermocouples 30 are positioned adjacent the device under test (DUT) locations 18. Each thermocouple 30 includes a first thermocouple wire 32 and a second thermocouple wire 34.

Each thermocouple 30 includes either of two dissimilar metals or P-N junctions. Each thermocouple 30 produces a temperature-dependent voltage, and this voltage can be interpreted to measure temperature. Each thermocouple 30 operates in view of the Peltier effect, that is, when a voltage is applied to one of the metals, a temperature gradient forms. One end of the thermocouple 30 get heated and the other end cools down. On the other hand, when one end of the thermocouple 30 is heated and the other is cooled, a potential gradient develops. Therefore, as per the Peltier effect, when two dissimilar metals are joined, electromagnetic fields (EMF) are generated within the circuit due to the different temperatures of the two junctions of the circuit. In other words, the Peltier effect creates a temperature difference by transferring heat between two electrical junctions.

Referring back to FIG. 1, a voltage or a current is applied to the thermocouples 30, which results in heating one of the regions in the thermocouple and cooling the other region. The controlled input voltage or current is used to control the temperature. In FIG. 1, the thermocouples 30 are placed between the probe pins 20 with DUTs 18 alongside the pads 16. A single thermocouple 30 is illustrated between each of the probe pins 20.

As a result, localized heating and cooling of the DUT is realized, thus eliminating the need to subject the entire wafer to temperature testing.

Figure 2:
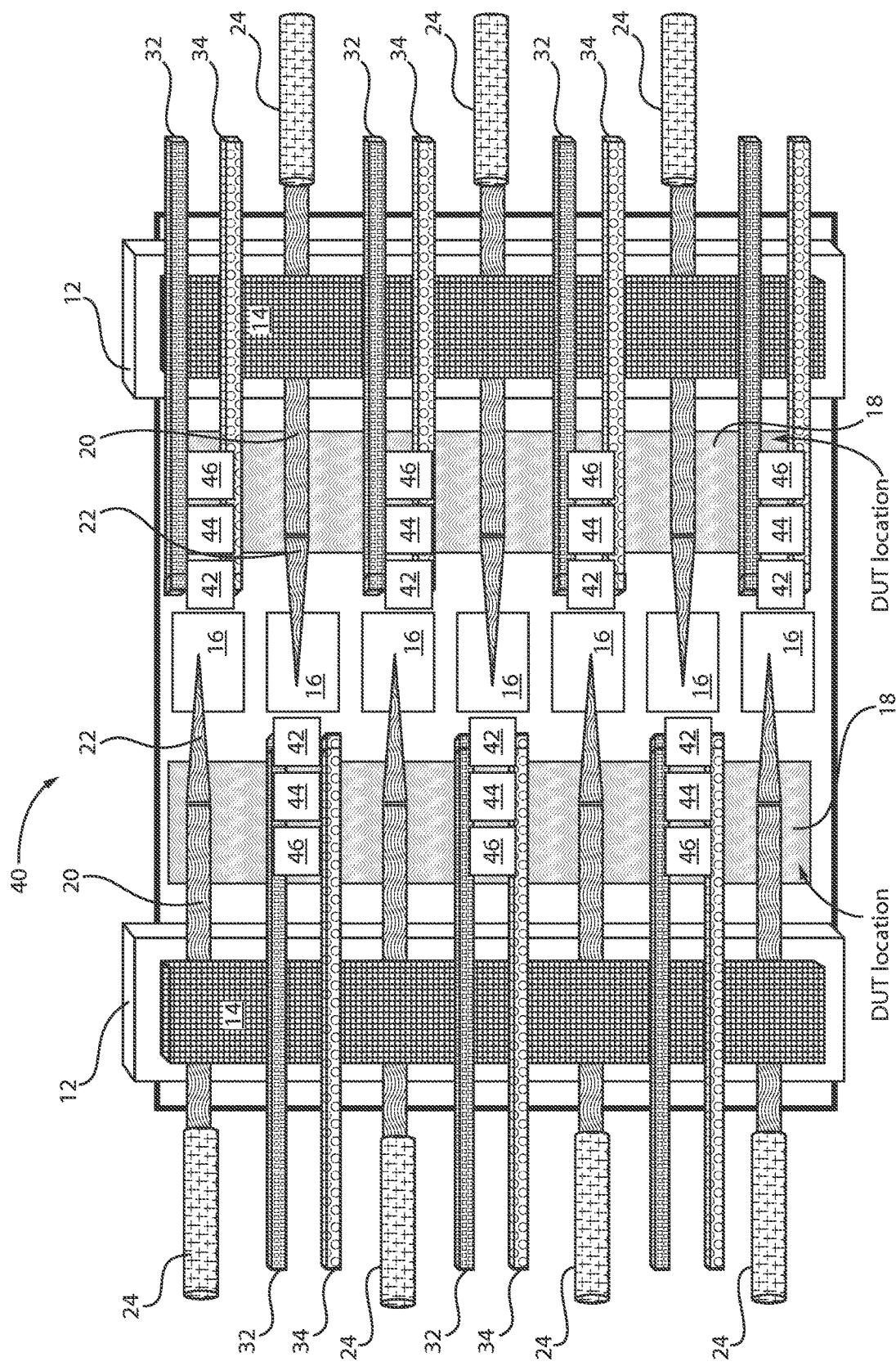
FIG. 2 illustrates testing of a device where a thermocouple array is placed between each of the probe pins along the wafer pads, in accordance with an embodiment of the present invention.

FIG. 2 illustrates testing of a device where a thermocouple array is placed between each of the probe pins along the wafer pads, in accordance with an embodiment of the present invention.

In various example embodiments, the testing system 40 includes a plurality of probe pins 20 each including a probe tip 22 at a distal end thereof. The probe tips 22 are positioned over a plurality of pads 16. The proximal end of the plurality of probe pins 20 includes a non-magnetic sheath 24 over copper. The plurality of probe pins 20 extend over a ceramic ring 12 including an epoxy 14 thereon. A thermocouple array including thermocouples 42, 44, 46 is placed or positioned between the plurality of probe pins 20. At least one of the thermocouples 42, 44, 46 is positioned adjacent the device under test (DUT) locations 18. At least one of the thermocouples 42, 44, 46 is positioned over the DUT locations 18. Each thermocouple 42, 44, 46 of the thermocouple array includes a first thermocouple wire 32 and a second thermocouple wire 34.

A voltage or a current is applied to the thermocouples 42, 44, 46 of the thermocouple array, which results in heating one of the regions in the thermocouples and cooling the other regions. The controlled input voltage or current is used to control the temperature. The thermocouples 42, 44, 46 of the thermocouple array are placed between the probe pins 20 with DUTs 18 alongside the pads 16.

As a result, localized heating and cooling of the DUT is realized, thus eliminating the need to subject the entire wafer to temperature testing.

Figure 3:
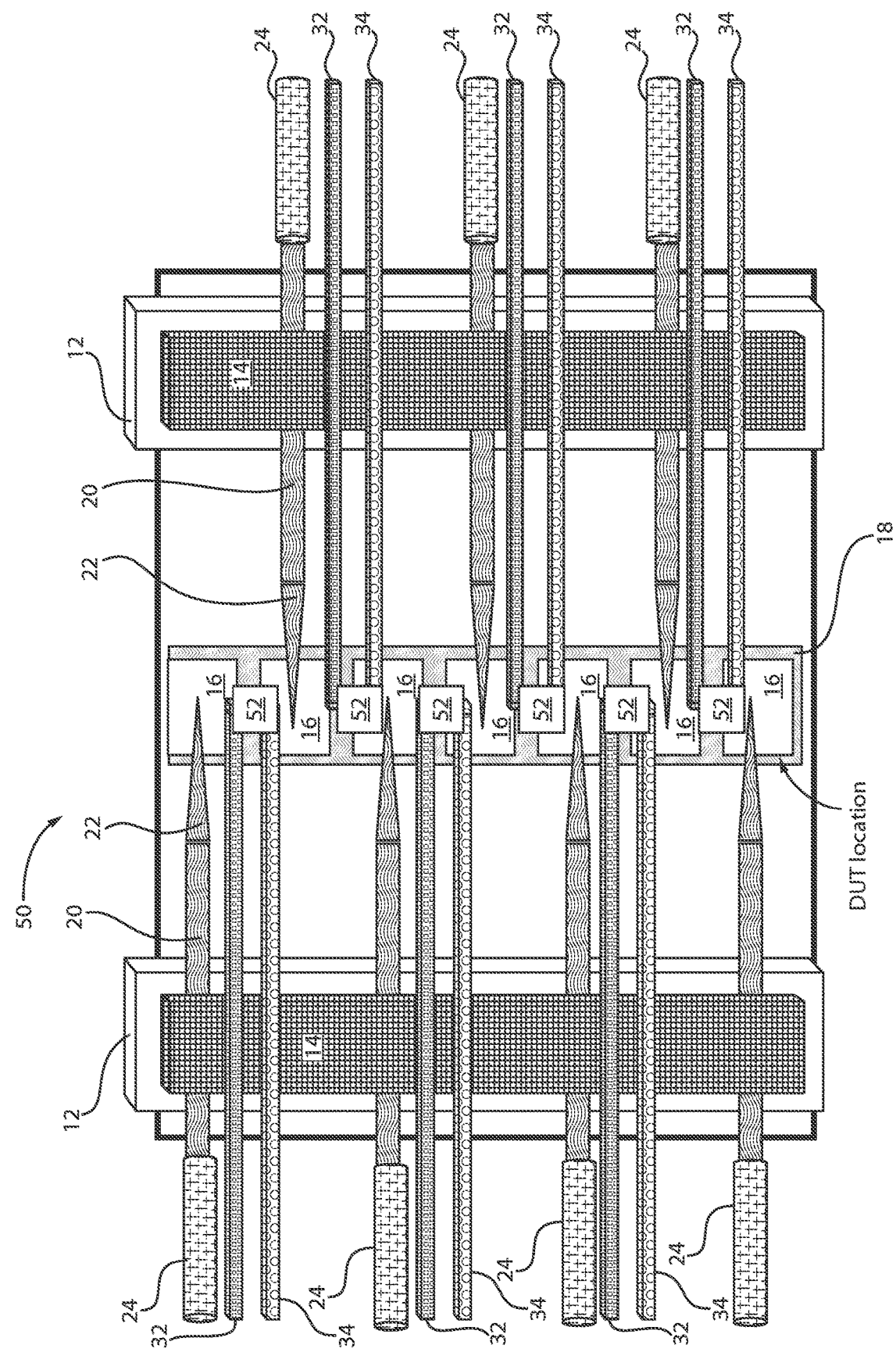
FIG. 3 illustrates testing of a device where a single thermocouple is placed between each of the probe pins and between the wafer pads, in accordance with an embodiment of the present invention.

FIG. 3 illustrates testing of a device where a single thermocouple is placed between each of the probe pins and between the wafer pads, in accordance with an embodiment of the present invention.

In various example embodiments, the testing system 50 includes a plurality of probe pins 20 each including a probe tip 22 at a distal end thereof. The probe tips 22 are positioned over a plurality of pads 16. The proximal end of the plurality of probe pins 20 includes a non-magnetic sheath 24 over copper. The plurality of probe pins 20 extend over a ceramic ring 12 including an epoxy 14 thereon. A thermocouple 52 is placed or positioned between the probe tips 22 of the plurality of probe pins 20. The thermocouples 52 are positioned adjacent the probe tips 22 of the plurality of probe pins 20. The thermocouples 52 are positioned over the device under test (DUT) location 18. Moreover, each of the thermocouples 52 is placed between the pads 16. Each thermocouple 52 includes a first thermocouple wire 32 and a second thermocouple wire 34.

A voltage or a current is applied to the thermocouples 52, which results in heating one of the regions in the thermocouple and cooling the other region. The controlled input voltage or current is used to control the temperature. The thermocouples 52 are placed between the probe pins 20 with DUT 18 being between the pads 16. A single thermocouple 52 is illustrated between each of the probe pins 20.

As a result, localized heating and cooling of the DUT is realized, thus eliminating the need to subject the entire wafer to temperature testing.

Figure 4:
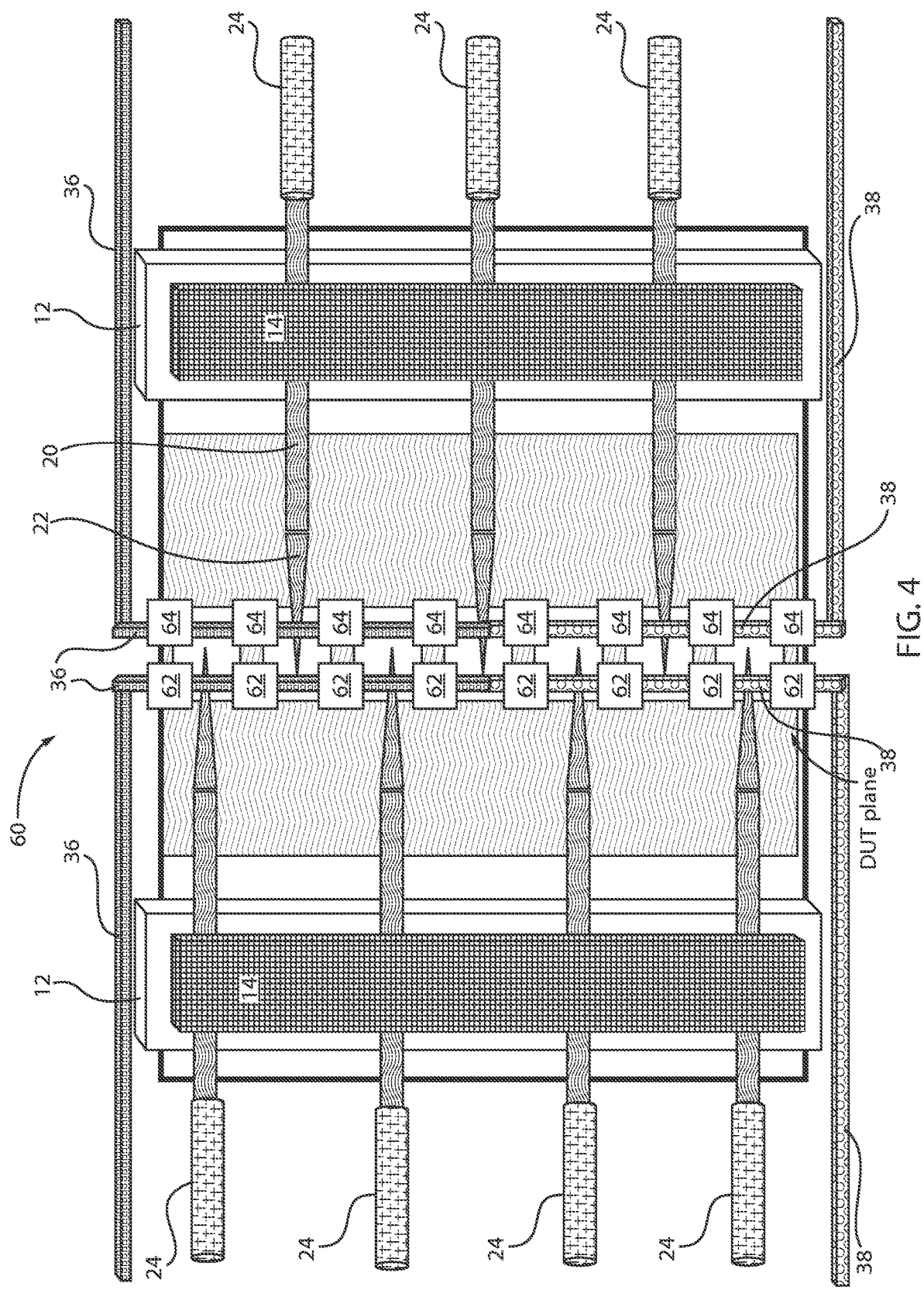
FIG. 4 illustrates testing of a device where a thermocouple array is placed between each of the probe pins and between the wafer pads, in accordance with an embodiment of the present invention.

FIG. 4 illustrates testing of a device where a thermocouple array is placed between each of the probe pins and between the wafer pads, in accordance with an embodiment of the present invention.

In various example embodiments, the testing system 60 includes a plurality of probe pins 20 each including a probe tip 22 at a distal end thereof. The probe tips 22 are positioned over a plurality of pads 16. The proximal end of the plurality of probe pins 20 includes a non-magnetic sheath 24 over copper. The plurality of probe pins 20 extend over a ceramic ring 12 including an epoxy 14 thereon. Thermocouples 62, 64 are placed or positioned between the probe tips 22 of the plurality of probe pins 20. Thermocouples 62, 64 are positioned adjacent the probe tips 22 of the plurality of probe pins 20. Thermocouples 62, 64 are positioned adjacent the DUT location 18. The first thermocouple 62 is connected to a first thermocouple wire 36 and a second thermocouple wire 38. Similarly, the second thermocouple 64 is connected to the first thermocouple wire 36 and the second thermocouple wire 38.

The first and second thermocouple wires 36, 38 do not extend directly between the plurality of probe pins 20, as in FIGS. 1-3. Instead, the first thermocouple wire 36 extends over the pads 16 on a top portion of the system 60 and the second thermocouple wire 38 extends under the pads 16 on a bottom portion of the system 60. The first and second thermocouple wires 36, 38 extend along the outer periphery of the system 60. Stated differently, the first and second thermocouple wires 36, 38 surround all of the probe pins 20. Each of the first and second thermocouple wires 36, 38 has a substantially or generally L-shaped or inverted L-shaped configuration.

A voltage or a current is applied to the thermocouples 62, 64, which results in heating one of the regions in the thermocouple and cooling the other region. The controlled input voltage or current is used to control the temperature. The thermocouples 62, 64 are placed along the probe tips 22, along the edges of the DUT 18, and over the pads 16.

As a result, localized heating and cooling of the DUT is realized, thus eliminating the need to subject the entire wafer to temperature testing.

Figure 5:
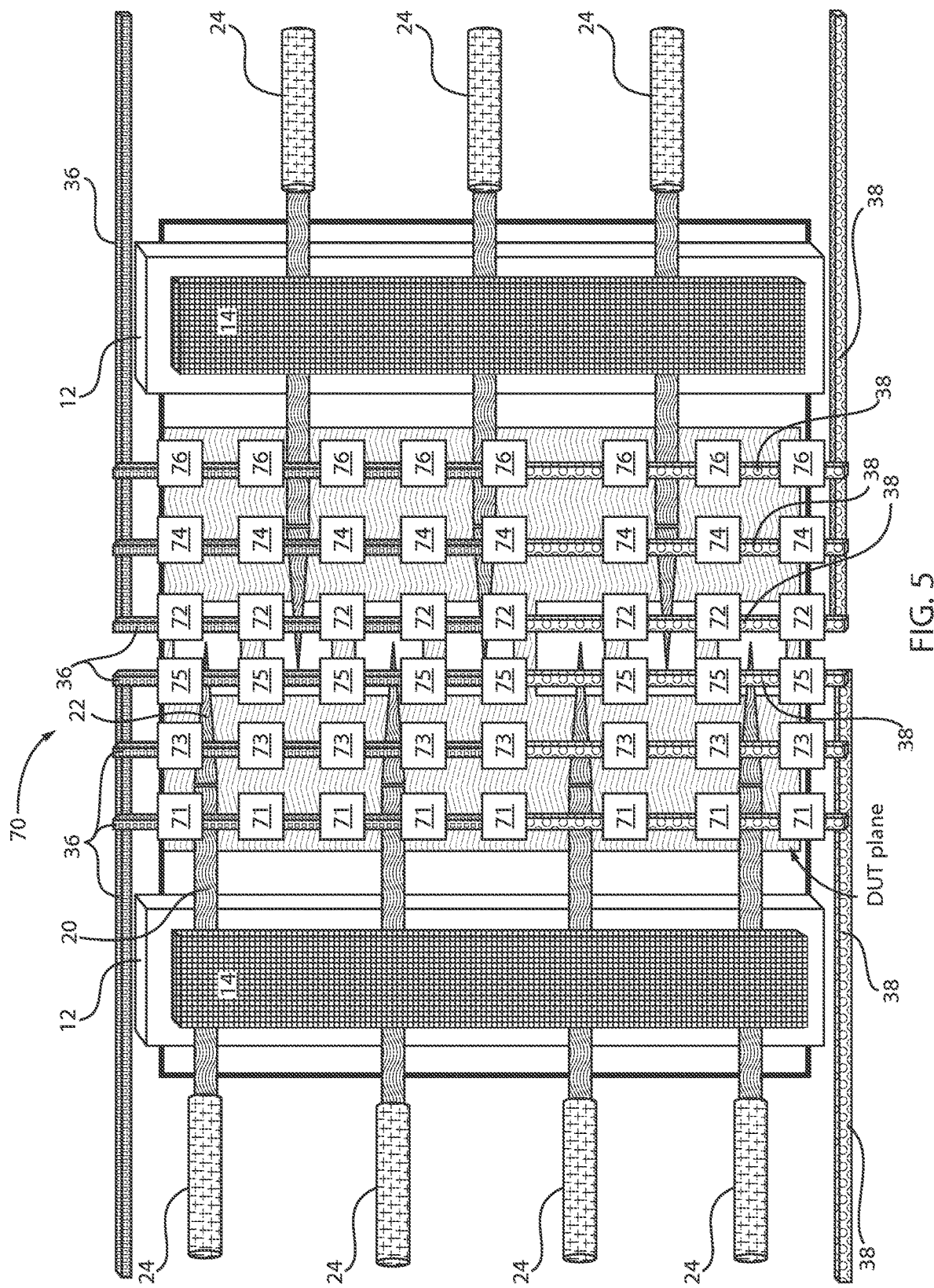
FIG. 5 illustrates testing of a device where a thermocouple array with multiple thermocouples in parallel is placed between each of the probe pins and between the wafer pads, in accordance with an embodiment of the present invention.

FIG. 5 illustrates testing of a device where a thermocouple array with multiple thermocouples in parallel is placed between each of the probe pins and between the wafer pads, in accordance with an embodiment of the present invention.

In various example embodiments, the testing system 70 includes a plurality of probe pins 20 each including a probe tip 22 at a distal end thereof. The probe tips 22 are positioned over a plurality of pads 16. The proximal end of the plurality of probe pins 20 includes a non-magnetic sheath 24 over copper. The plurality of probe pins 20 extend over a ceramic ring 12 including an epoxy 14 thereon. Thermocouples 71, 73, 75, 72, 74, 76 are placed or positioned between the plurality of probe pins 20. Thermocouples 71, 73, 75, 72, 74, 76 are positioned over the DUT location 18. Thermocouples 71, 73, 75, 72, 74, 76 are connected to a first thermocouple wire 36 and a second thermocouple wire 38.

The first thermocouple wire 36 extends on a top portion of the system 70 and the second thermocouple 38 extends on a bottom portion of system 70. The first thermocouple wires 36 are parallel to each other on the top portion of the system 70 and the second thermocouple wires 38 are parallel to each other on the bottom portion of the system 70. Stated differently, a plurality of thermocouples each including a first thermocouple wire and a second thermocouple wire are provided such that a first series of thermocouples of the plurality of thermocouples are electrically connected to the first thermocouple wire and a second series of thermocouples of the plurality of thermocouples are electrically connected to the second thermocouple wire.

As a result, localized heating and cooling of the DUT is realized, thus eliminating the need to subject the entire wafer to temperature testing.

Regarding FIGS. 1-5, a thermocouple can be placed adjacent to at least one probe pin. In particular, regarding FIGS. 1-3, at least one thermocouple is placed or positioned between a pair of probe pins. In one instance, the pair of probe pins and the thermocouple placed therebetween are connected to a common base. In another instance, a first probe pin and a thermocouple adjacent thereto are connected to a common base and the second probe pin is connected to a second base different than the common base. The hot side of the thermocouple can be in closer proximity to the DUT than the cold side. Alternatively, the cold side of the thermocouple can be in closer proximity to the DUT than the hot side. The thermocouple can be placed over the edge of at least one probe tip and the thermocouple can share a common base with at least one probe pin.

Figure 6:
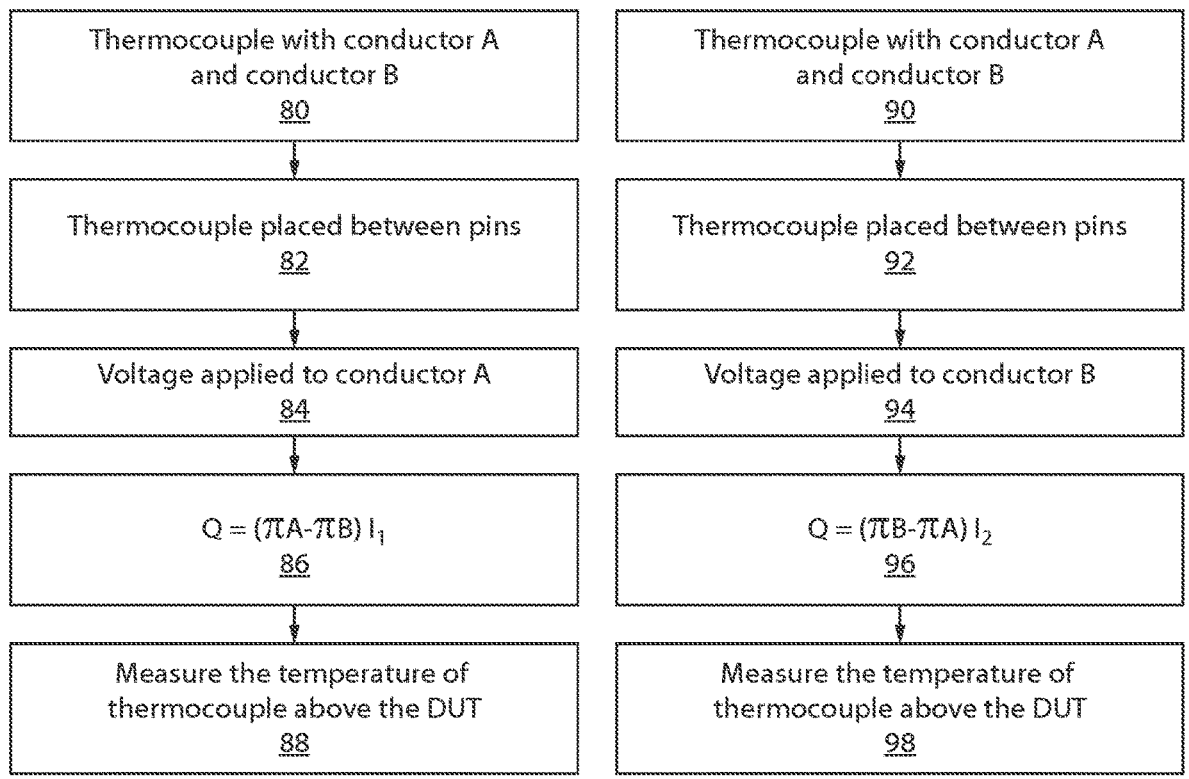
FIG. 6 is a block/flow diagram of an exemplary method for placing a single thermocouple between each of the probe pins along the pads where voltage is applied to the conductors, in accordance with an embodiment of the present invention.

FIG. 6 is a block/flow diagram of an exemplary method for placing a single thermocouple between each of the probe pins along the pads where voltage is applied to the conductors, in accordance with an embodiment of the present invention.

Regarding conductor A:

At block 80, a thermocouple is provided including conductor A and conductor B.

At block 82, the thermocouple is placed between probe pins.

At block 84, voltage is applied to conductor A.

At block 86, $Q=(\pi A-\pi B)I_1$, where Q is the Peltier heat generated at the junction, $\pi A$ is the Peltier coefficient of conductor A, $\pi B$ is the Peltier coefficient of conductor B, and $I_1$ is the current flowing from conductor A to conductor B, where $\pi$ depends on the materials forming the junction and the temperature.

At block 88, the temperature of the thermocouple is measured above the DUT.

Regarding conductor B:

At block 90, a thermocouple is provided including conductor A and conductor B.

At block 92, the thermocouple is placed between probe pins.

At block 94, voltage is applied to conductor B.

At block 96, $Q=(\pi B-\pi A)I_2$, where Q is the Peltier heat generated at the junction, $\pi A$ is the Peltier coefficient of conductor A, $\pi B$ is the Peltier coefficient of conductor B, and $I_2$ is the current flowing from conductor B to conductor A, where $\pi$ depends on the materials forming the junction and the temperature.

At block 98, the temperature of the thermocouple is measured above the DUT.

Figure 7:
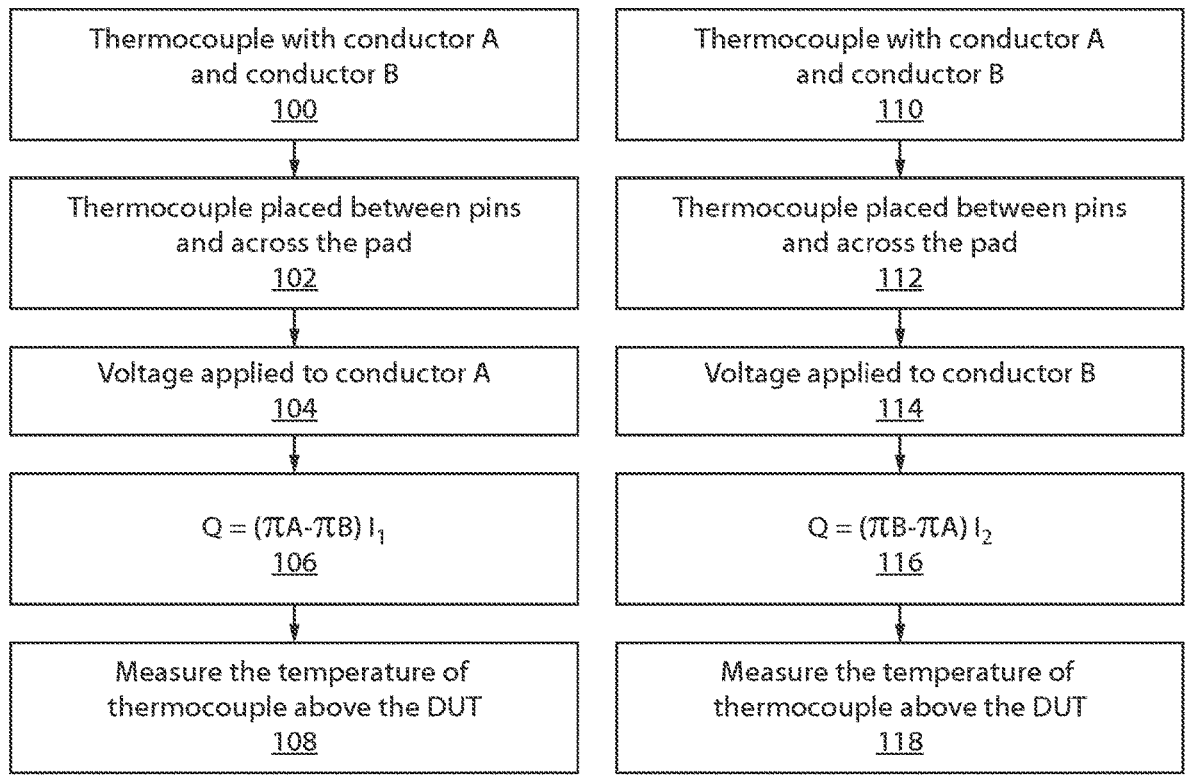
FIG. 7 is a block/flow diagram of an exemplary method for placing a single thermocouple between each of the probe pins and between the pads where voltage is applied to the conductors, in accordance with an embodiment of the present invention.

FIG. 7 is a block/flow diagram of an exemplary method for placing a single thermocouple between each of the probe pins and between the pads where voltage is applied to the conductors, in accordance with an embodiment of the present invention.

Regarding conductor A:

At block 100, a thermocouple is provided including conductor A and conductor B.

At block 102, the thermocouple is placed between probe pins and across the pad.

At block 104, voltage is applied to conductor A.

At block 106, $Q=(\pi A-\pi B)I_1$, where Q is the Peltier heat generated at the junction, $\pi A$ is the Peltier coefficient of conductor A, $\pi B$ is the Peltier coefficient of conductor B, and $I_1$ is the current flowing from conductor A to conductor B, where $\pi$ depends on the materials forming the junction and the temperature.

At block 108, the temperature of the thermocouple is measured above the DUT.

Regarding conductor B:

At block 110, a thermocouple is provided including conductor A and conductor B.

At block 112, the thermocouple is placed between probe pins and across the pad.

At block 114, voltage is applied to conductor B.

At block 116, $Q=(\pi B-\pi A)I_2$, where Q is the Peltier heat generated at the junction, $\pi A$ is the Peltier coefficient of conductor A, $\pi B$ is the Peltier coefficient of conductor B, and $I_2$ is the current flowing from conductor B to conductor A, where $\pi$ depends on the materials forming the junction and the temperature.

At block 118, the temperature of the thermocouple is measured above the DUT.

Figure 8:
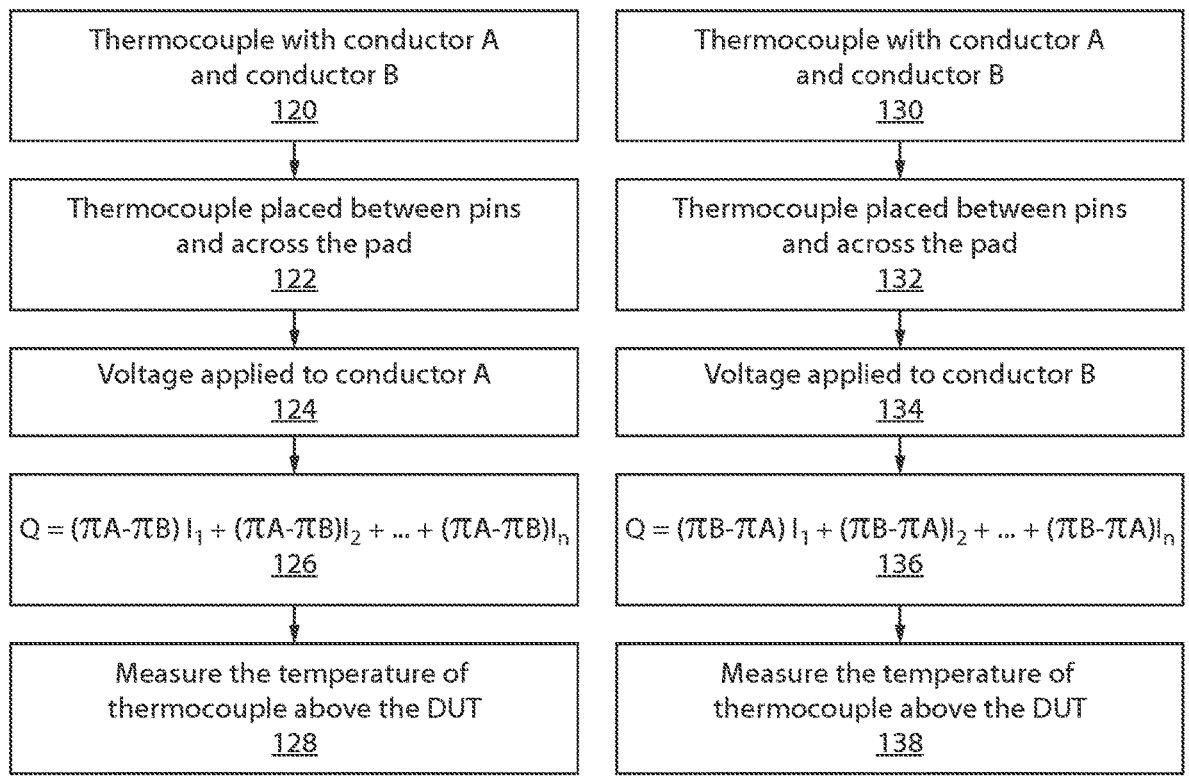
FIG. 8 is a block/flow diagram of an exemplary method for placing a thermocouple array with multiple thermocouples in parallel between each of the probe pins and between the pads where voltage is applied to the conductors, in accordance with an embodiment of the present invention.

FIG. 8 is a block/flow diagram of an exemplary method for placing a thermocouple array with multiple thermocouples in parallel between each of the probe pins and between the pads where voltage is applied to the conductors, in accordance with an embodiment of the present invention.

Regarding conductor A:

At block 120, a thermocouple is provided including conductor A and conductor B.

At block 122, the thermocouple is placed between probe pins and across the pad.

At block 124, voltage is applied to conductor A.

At block 126, $Q=(\pi A-\pi B)I_1+(\pi A-\pi B)I_2+\ldots+(\pi A-\pi B)I_n$, where Q is the Peltier heat generated at the junction, $\pi A$ is the Peltier coefficient of conductor A, $\pi B$ is the Peltier coefficient of conductor B, $I_1$ is the current flowing through branch 1, $I_2$ is the current flowing through branch 2, and $I_n$ is the current flowing through branch n, where $\pi$ depends on the materials forming the junction and the temperature.

At block 128, the temperature of the thermocouple is measured above the DUT.

Regarding conductor B:

At block 130, a thermocouple is provided including conductor A and conductor B.

At block 132, the thermocouple is placed between probe pins and across the pad.

At block 134, voltage is applied to conductor B.

At block 136, $Q=(\pi B-\pi A)I_1+(\pi B-\pi A)I_2+\ldots+(\pi B-\pi A)I_n$, where Q is the Peltier heat generated at the junction, $\pi A$ is the Peltier coefficient of conductor A, $\pi B$ is the Peltier coefficient of conductor B, $I_1$ is the current flowing through branch 1, $I_2$ is the current flowing through branch 2, and $I_n$ is the current flowing through branch n, where $\pi$ depends on the materials forming the junction and the temperature.

At block 138, the temperature of the thermocouple is measured above the DUT.

Figure 9:
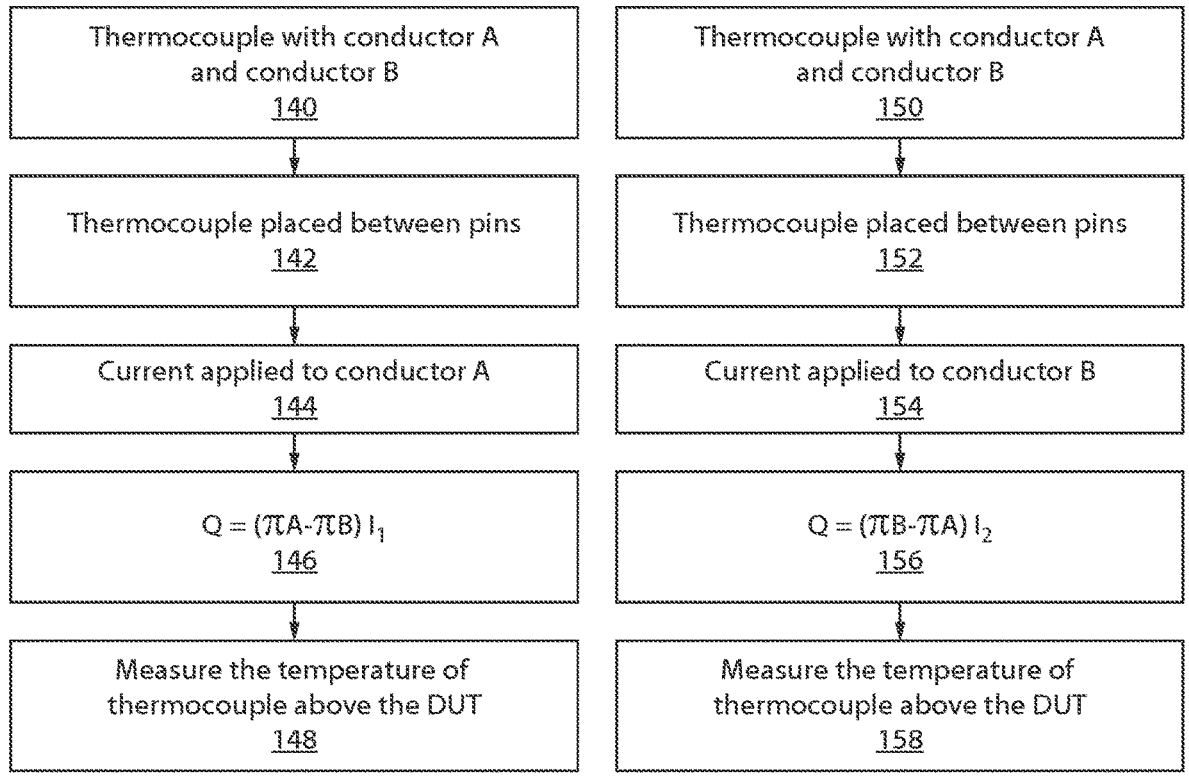
FIG. 9 is a block/flow diagram of an exemplary method for placing a single thermocouple between each of the probe pins along the pads where current is applied to the conductors, in accordance with an embodiment of the present invention.

FIG. 9 is a block/flow diagram of an exemplary method for placing a single thermocouple between each of the probe pins along the pads where current is applied to the conductors, in accordance with an embodiment of the present invention.

Regarding conductor A:

At block 140, a thermocouple is provided including conductor A and conductor B.

At block 142, the thermocouple is placed between probe pins.

At block 144, current is applied to conductor A.

At block 146, $Q=(\pi A-\pi B)I_1$, where Q is the Peltier heat generated at the junction, $\pi A$ is the Peltier coefficient of conductor A, $\pi B$ is the Peltier coefficient of conductor B, and $I_1$ is the current flowing from conductor A to conductor B, where $\pi$ depends on the materials forming the junction and the temperature.

At block 148, the temperature of the thermocouple is measured above the DUT.

Regarding conductor B:

At block 150, a thermocouple is provided including conductor A and conductor B.

At block 152, the thermocouple is placed between probe pins.

At block 154, current is applied to conductor B.

At block 156, $Q=(\pi B-\pi A)I_2$, where Q is the Peltier heat generated at the junction, $\pi A$ is the Peltier coefficient of conductor A, $\pi B$ is the Peltier coefficient of conductor B, and $I_2$ is the current flowing from conductor B to conductor A, where $\pi$ depends on the materials forming the junction and the temperature.

At block 158, the temperature of the thermocouple is measured above the DUT.

Figure 10:
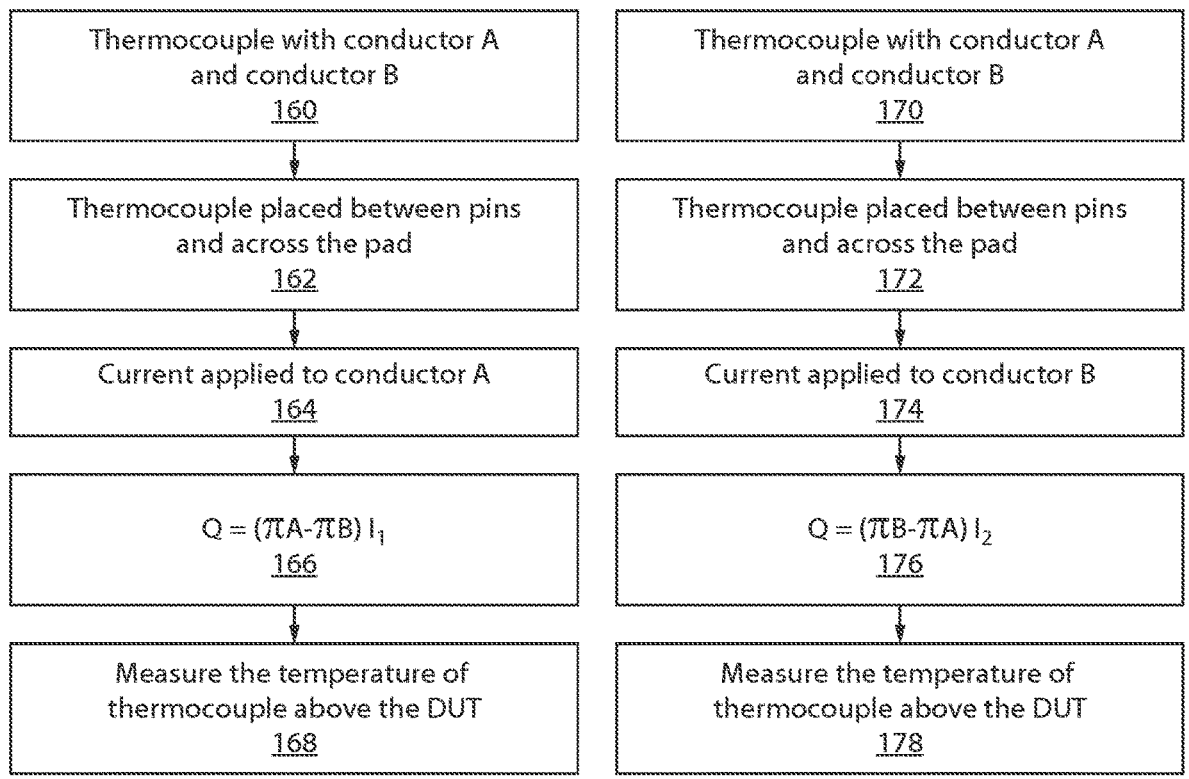
FIG. 10 is a block/flow diagram of an exemplary method for placing a single thermocouple between each of the probe pins and between the pads where current is applied to the conductors, in accordance with an embodiment of the present invention.

FIG. 10 is a block/flow diagram of an exemplary method for placing a single thermocouple between each of the probe pins and between the pads where current is applied to the conductors, in accordance with an embodiment of the present invention.

Regarding conductor A:

At block 160, a thermocouple is provided including conductor A and conductor B.

At block 162, the thermocouple is placed between probe pins and across the pad.

At block 164, current is applied to conductor A.

At block 166, $Q=(\pi A-\pi B)I_1$, where Q is the Peltier heat generated at the junction, $\pi A$ is the Peltier coefficient of conductor A, $\pi B$ is the Peltier coefficient of conductor B, and $I_1$ is the current flowing from conductor A to conductor B, where $\pi$ depends on the materials forming the junction and the temperature.

At block 168, the temperature of the thermocouple is measured above the DUT.

Regarding conductor B:

At block 170, a thermocouple is provided including conductor A and conductor B.

At block 172, the thermocouple is placed between probe pins and across the pad.

At block 174, current is applied to conductor B.

At block 176, $Q=(\pi B-\pi A)I_2$, where Q is the Peltier heat generated at the junction, $\pi A$ is the Peltier coefficient of conductor A, $\pi B$ is the Peltier coefficient of conductor B, and $I_2$ is the current flowing from conductor B to conductor A, where $\pi$ depends on the materials forming the junction and the temperature.

At block 178, the temperature of the thermocouple is measured above the DUT.

Figure 11:
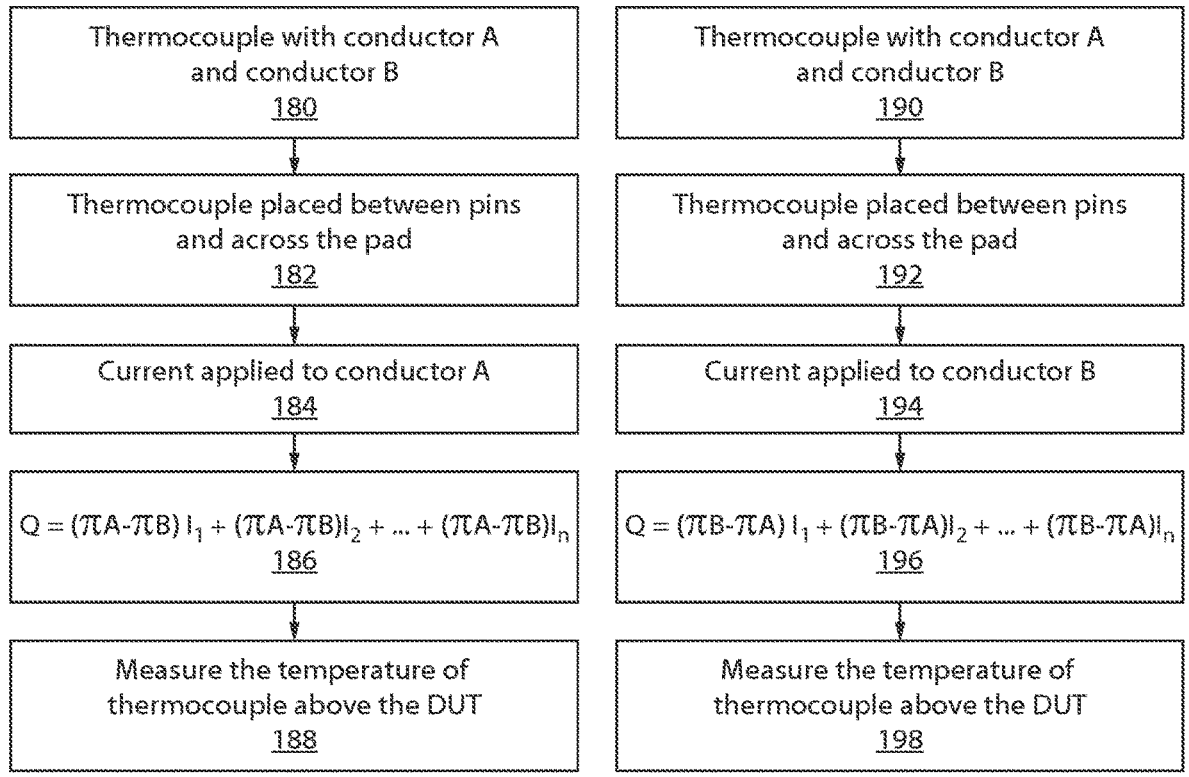
FIG. 11 is a block/flow diagram of an exemplary method for placing a thermocouple array with multiple thermocouples in parallel between each of the probe pins and between the pads where current is applied to the conductors, in accordance with an embodiment of the present invention.

FIG. 11 is a block/flow diagram of an exemplary method for placing a thermocouple array with multiple thermocouples in parallel between each of the probe pins and between the pads where current is applied to the conductors, in accordance with an embodiment of the present invention.

Regarding conductor A:

At block 180, a thermocouple is provided including conductor A and conductor B.

At block 182, the thermocouple is placed between probe pins and across the pad.

At block 184, current is applied to conductor A.

At block 186, $Q=(\pi A-\pi B)I_1+(\pi A-\pi B)I_2+\ldots+(\pi A-\pi B)I_n$, where Q is the Peltier heat generated at the junction, $\pi A$ is the Peltier coefficient of conductor A, $\pi B$ is the Peltier coefficient of conductor B, $I_1$ is the current flowing through branch 1, $I_2$ is the current flowing through branch 2, and $I_n$ is the current flowing through branch n, where $\pi$ depends on the materials forming the junction and the temperature.

At block 188, the temperature of the thermocouple is measured above the DUT.

Regarding conductor B:

At block 190, a thermocouple is provided including conductor A and conductor B.

At block 192, the thermocouple is placed between probe pins and across the pad.

At block 194, current is applied to conductor B.

At block 196, $Q=(\pi B-\pi A)I_1+(\pi B-\pi A)I_2+\ldots+(\pi B-\pi A)I_n$, where Q is the Peltier heat generated at the junction, $\pi A$ is the Peltier coefficient of conductor A, $\pi B$ is the Peltier coefficient of conductor B, $I_1$ is the current flowing through branch 1, $I_2$ is the current flowing through branch 2, and $I_n$ is the current flowing through branch n, where $\pi$ depends on the materials forming the junction and the temperature.

At block 198, the temperature of the thermocouple is measured above the DUT.

In conclusion, embodiments in accordance with the present invention provide a method and structure for strategically placing a probe card assembly above the DUT on a semiconductor wafer. A voltage or current input is applied to the thermocouple, which results in heating of one of the regions in the thermocouple and cooling of the other regions. The controlled input voltage or current is used to control the temperature. As a result, localized heating and cooling of the DUT is realized, thus eliminating the need to subject the entire wafer to temperature testing. The exemplary embodiments use the Peltier effect for localized heating and cooling of devices. In one embodiment, a thermocouple is placed in between the probe pins with devices alongside the pads (with single thermocouple or thermocouple array; FIGS. 1 and 2). In another embodiment, a thermocouple is placed in between the probe pins with devices between the pads (FIGS. 3 and 4). In yet another embodiment, a thermocouple array is placed between the probe pins with devices between the pads (FIG. 5).

It is to be understood that the present invention will be described in terms of a given illustrative architecture; however, other architectures, structures, substrate materials and process features and steps/blocks can be varied within the scope of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical mechanisms (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present embodiments. The compounds with additional elements will be referred to herein as alloys. Reference in the specification to "one embodiment" or "an embodiment" of the present invention, as well as other variations thereof, means that a particular feature, structure, characteristic, and so forth described in connection with the embodiment is included in at least one embodiment of the present invention. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Having described preferred embodiments of a method and structure for localized heating or cooling using a thermocouple between probe pins (which are intended to be illustrative and not limiting), it is noted that modifications and variations can be made by persons skilled in the art in light of the above teachings. It is therefore to be understood that changes may be made in the particular embodiments described which are within the scope of the invention as outlined by the appended claims. Having thus described aspects of the invention, with the details and particularity required by the patent laws, what is claimed and desired protected by Letters Patent is set forth in the appended claims.

The invention claimed is:

1. A system comprising:
probe pins each including a probe tip; and
a plurality of thermocouples arranged such that at least one thermocouple is positioned between a pair of the probe pins, wherein the plurality of thermocouples are placed between a plurality of pads.

2. The system of claim 1, wherein the plurality of thermocouples are adjacent a device under test (DUT).

3. The system of claim 1, wherein the plurality of thermocouples are above a DUT.

4. The system of claim 1, wherein the probe tips of the probe pins are placed over the plurality of pads.

5. The system of claim 1, wherein the at least one thermocouple positioned between the pair of the probe pins is a single thermocouple.

6. The system of claim 1, wherein the at least one thermocouple positioned between the pair of the probe pins is a thermocouple array.

7. The system of claim 1, wherein each of the plurality of thermocouples includes a first thermocouple wire and a second thermocouple wire.

8. The system of claim 7, wherein the first and second thermocouple wires of each of the plurality of thermocouples are placed between respective pairs of the probe pins.

9. The system of claim 7, wherein the first and second thermocouple wires of each of the plurality of thermocouples are placed to surround all of the probe pins.

10. A system comprising:
   probe pins each including a probe tip; and
   a plurality of thermocouples each including a first thermocouple wire and a second thermocouple wire such that a first series of thermocouples of the plurality of thermocouples are electrically connected to the first thermocouple wire and a second series of thermocouples of the plurality of thermocouples are electrically connected to the second thermocouple wire.

11. The system of claim 10, wherein the plurality of thermocouples are above a device under test (DUT).

12. The system of claim 10, wherein the plurality of thermocouples are adjacent a plurality of pads.

13. The system of claim 10, wherein the plurality of thermocouples are placed between a plurality of pads.

14. A method comprising:
   using probe pins each including a probe tip; and
   arranging a plurality of thermocouples such that at least one thermocouple is positioned between a pair of the probe pins, wherein the plurality of thermocouples are placed between a plurality of pads.

15. The method of claim 14, wherein the plurality of thermocouples are adjacent a device under test (DUT).

16. The method of claim 14, wherein the plurality of thermocouples are over a DUT.

* * * * *